(12) United States Patent
Iwasa et al.

(10) Patent No.: US 7,687,142 B2
(45) Date of Patent: *Mar. 30, 2010

(54) LAMINATE FOR PRINTED WIRING BOARD

(75) Inventors: Tsuyoshi Iwasa, Ichihara (JP); Atsushi Funaki, Ichihara (JP); Yoshiaki Higuchi, Ichihara (JP)

(73) Assignee: Asahi Glass Company, Limited, Tokyo (JP)

( * ) Notice: Subject to any disclaimer, the term of this patent is extended or adjusted under 35 U.S.C. 154(b) by 68 days.

This patent is subject to a terminal disclaimer.

(21) Appl. No.: 11/760,809

(22) Filed: Jun. 11, 2007

(65) Prior Publication Data

US 2007/0246255 A1 Oct. 25, 2007

Related U.S. Application Data

(63) Continuation of application No. PCT/JP2005/022489, filed on Dec. 7, 2005.

(30) Foreign Application Priority Data

Dec. 9, 2004 (JP) .............................. 2004-356277

(51) Int. Cl.
  *B32B 15/082* (2006.01)
  *B32B 15/20* (2006.01)
  *B32B 27/30* (2006.01)
(52) U.S. Cl. .................... 428/335; 428/336; 428/421; 428/422; 428/457; 174/264
(58) Field of Classification Search ................ None
See application file for complete search history.

(56) References Cited

U.S. PATENT DOCUMENTS 4,869,956 A 9/1989 Bridges et al.

(Continued)

FOREIGN PATENT DOCUMENTS

EP 0 911 347 4/1999

(Continued)

OTHER PUBLICATIONS

U.S. Appl. No. 11/764,405, filed Jun. 18, 2007, Iwasa et al.

*Primary Examiner*—Ramsey Zacharia
(74) *Attorney, Agent, or Firm*—Oblon, Spivak, McClelland, Maier & Neustadt, L.L.P.

(57) ABSTRACT

A laminate for a printed wiring board having a laminate structure comprising an electrical insulator layer (A) and an electrical conductor layer (B) bonded directly to each other, wherein the electrical insulator layer (A) is formed of a fluorocopolymer comprising repeating units (a) based on tetrafluoroethylene and/or chlorotrifluoroethylene, repeating units (b) based on a fluoromonomer excluding tetrafluoroethylene and chlorotrifluoroethylene, and repeating units (c) based on a monomer having an acid anhydride residue and a polymerizable unsaturated bond in amounts of (a) being from 50 to 99.89 mol %, (b) being from 0.1 to 49.99 mol % and (c) being from 0.01 to 5 mol %, based on ((a)+(b)+(c)), and the electrical conductor layer (B) has a surface roughness of at most 10 μm on the side being in contact with the electrical insulator layer (A). The laminate for a printed wiring board is excellent in signal response in a high frequency region.

21 Claims, 1 Drawing Sheet

U.S. PATENT DOCUMENTS

| | | |
|---|---|---|
| 6,703,465 B2 | 3/2004 | Funaki et al. |
| 7,078,470 B2 | 7/2006 | Funaki et al. |
| 7,112,640 B2 | 9/2006 | Funaki et al. |
| 2003/0024666 A1 | 2/2003 | Suzuki et al. |
| 2008/0107866 A1* | 5/2008 | Iwasa et al. ........... 428/141 |

FOREIGN PATENT DOCUMENTS

| | | |
|---|---|---|
| JP | 63 290735 | 11/1988 |
| JP | 2-42786 | 2/1990 |
| JP | 5-55746 | 3/1993 |
| JP | 07 025954 | 1/1995 |
| JP | 07 173446 | 7/1995 |
| JP | 11-193312 | 7/1999 |
| JP | 11-199738 | 7/1999 |
| JP | 2004-195776 | 7/2004 |
| JP | 2004-277689 | 10/2004 |
| WO | 89/01407 | 2/1989 |
| WO | 97/49549 | 12/1997 |
| WO | WO 03/102277 A1 | 12/2003 |

* cited by examiner

LAMINATE FOR PRINTED WIRING BOARD

TECHNICAL FIELD

The present invention relates to a laminate for a printed wiring board.

BACKGROUND ART

In signal transmission in a high frequency region, it is usually desired to improve the transmission rate and to reduce noises, and studies are being made with respect to the board materials for printed wiring boards, the wiring techniques, the circuit configurations, etc.

In a printed wiring board, the signal transmission rate is inversely proportional to the square root of the dielectric constant of the board material for the printed wiring board, and it is possible to increase the transmission rate and reduce noises if a low dielectric constant material is employed as the board material. Further, it is possible to reduce an unnecessary capacitance to be generated between adjacent circuits by using a board material having a low dielectric constant. Accordingly, a board material having a low dielectric constant is suitable for a printed wiring board handling a very weak high speed signal in e.g. a high speed digital circuit or an amplifier circuit in a microwave transceiver circuit (JP-A-2-42786).

A printed wiring board made of an epoxy resin is the most common printed wiring board, but the dielectric constant is high and cannot be applied to a high frequency region. Such a printed wiring board can easily be produced by a step of impregnating a glass fiber woven fabric with an epoxy resin, followed by drying, a step of bringing the impregnated epoxy resin to a semi-cured state to form a prepreg, and a step of laminating an electrically conductive metal foil on the prepreg.

A fluororesin such as polytetrafluoroethylene (hereinafter referred to as PTFE) has characteristics such that the dielectric constant and dielectric loss tangent are low. However, the adhesion between the fluororesin and the metal is not sufficient, and it has been difficult to produce a printed wiring board made of a fluororesin by such a simple process for the above-mentioned printed wiring board made of an epoxy resin. Usually, a printed wiring board of a fluororesin is produced by bonding an electrically conductive metal foil and an electrical insulator layer made of a PTFE-impregnated glass fiber fabric obtained by impregnating a glass fiber fabric with an aqueous dispersion of e.g. PTFE, followed by baking, via an adhesive layer made of e.g. a low melting point thermosetting resin, an adhesive film or an adhesive agent (JP-A-11-199738).

However, the printed wiring board of a fluororesin produced by the above process, has an adhesive layer having high dielectric constant and dielectric loss tangent, whereby the characteristics of the fluororesin i.e. the low dielectric constant and dielectric loss tangent will be lost. If such a printed wiring board is applied to a high frequency region, the transmission loss tends to be very high.

Further, in a high frequency region, a skin effect will appear. The skin effect is a phenomenon such that a high frequency electrical current will flow only in the vicinity of the surface of the electrical conductor layer. For example, the electric current will flow only within a range of 2.3 μm in depth from the surface with 1 GHz or within a range of 0.7 μm in depth from the surface with 10 GHz.

Also in a case where an adhesive is employed, in order to improve the adhesion between the electrical insulator layer and the electrical conductor layer, irregularities of about 3 μm are provided on the surface of the electrical conductor layer on the side being in contact with the electrical insulator layer, but there will be a deviation in the signal arrival time between the surface having such irregularities (hereinafter referred to also as a roughened surface) and a non-roughened surface. Therefore, such irregularities are required to be profiled as low as possible (JP-A-5-55746).

Under the circumstances, it is desired to develop a printed wiring board of a fluororesin which requires no adhesive layer and in which the irregularities on the electrical conductor layer surface are low-profiled, and the electrical conductor layer and the electrical insulator layer are directly bonded.

DISCLOSURE OF THE INVENTION

Object to be Accomplished by the Invention

It is an object of the present invention to provide a laminate for a printed wiring board of a fluororesin excellent in signal response in a high frequency region.

Means to Accomplish the Object

The present invention provides a laminate for a printed wiring board having a laminate structure comprising an electrical insulator layer (A) and an electrical conductor layer (B) bonded directly to each other, wherein the electrical insulator layer (A) is formed of a fluorocopolymer comprising repeating units (a) based on tetrafluoroethylene and/or chlorotrifluoroethylene, repeating units (b) based on a fluoromonomer excluding tetrafluoroethylene and chlorotrifluoroethylene, and repeating units (c) based on a monomer having an acid anhydride residue and a polymerizable unsaturated bond in amounts of (a) being from 50 to 99.89 mol %, (b) being from 0.1 to 49.99 mol % and (c) being from 0.01 to 5 mol %, based on ((a)+(b)+(c)), and the electrical conductor layer (B) has a surface roughness of at most 10 μm on the side being in contact with the electrical insulator layer (A).

Effects of the Invention

The laminate for a printed wiring board of the present invention is excellent in adhesion between the electrical insulator layer (A) and the electrical conductor layer (B). Further, the laminate for a printed wiring board of the present invention is excellent in signal response to high frequency signals, without losing the characteristics of the fluorocopolymer such as the low dielectric constant and low dielectric loss tangent. It operates very stably in a high frequency region and provides a printed wiring board excellent in electrical characteristics with a low dielectric tangent loss. The laminate for a printed wiring board of the present invention is excellent in the applicability to a high frequency region with the irregularities on the surface of the electrical conductor layer (B) being low-profiled. Further, its production process is simple, and it is excellent in the productivity, whereby the printed wiring board can be produced at a low cost.

MEANINGS OF SYMBOLS

Figure 1:
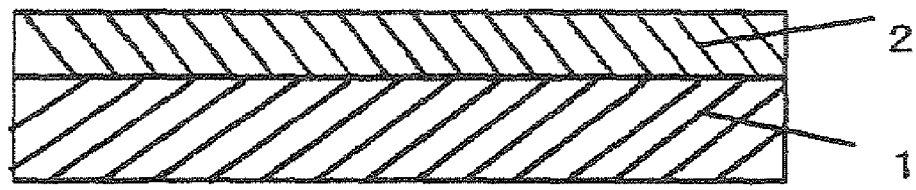
FIG. 1 is a cross-sectional view illustrating an embodiment of the laminate for a printed wiring board of the present invention.

1: Electrical insulator layer (A) formed of a fluorocopolymer
2: Electrical conductor layer (B)

BEST MODE FOR CARRYING OUT THE INVENTION

The fluorocopolymer in the present invention comprises repeating units (a) based on tetrafluoroethylene (hereinafter referred to as TFE) and/or chlorotrifluoroethylene (hereinafter referred to as CTFE), repeating units (b) based on a fluoromonomer excluding TFE and CTFE, and repeating units (c) based on a monomer having an acid anhydride residue and a polymerizable unsaturated bond.

The fluoromonomer in the present invention may, for example, be a fluoroolefin such as vinyl fluoride, vinylidene fluoride (hereinafter referred to as VdF), trifluoroethylene or hexafluoropropylene (hereinafter referred to as HFP), $CF_2=CFOR^1$ (wherein $R^1$ is a $C_{1-10}$ perfluoroalkyl group which may contain an oxygen atom), $CF_2=CFOR^2SO_2X^1$ (wherein $R^2$ is a $C_{1-10}$ perfluoroalkylene group which may contain an oxygen atom between carbon atoms, and $X^1$ is a halogen atom or a hydroxyl group), $CF_2=CFOR^3CO_2X^2$ (wherein $R^3$ is a $C_{1-10}$ perfluoroalkyl group which may contain an oxygen atom between carbon atoms, and $X^2$ is a hydrogen atom or an alkyl group having at most 3 carbon atoms), $CF_2=CF(CF_2)_pOCF=CF_2$ (wherein p is 1 or 2), $CH_2=CX^3(CF_2)_qX^4$ (wherein $X^3$ is a hydrogen atom or a fluorine atom, q is an integer of from 2 to 10, and $X^4$ is a hydrogen atom or a fluorine atom) or a perfluoro(2-methylene-4-methyl-1,3-dioxolane).

Preferably, it is at least one member selected from the group consisting of VdF, HFP, $CF_2=CFOR^1$ and $CH_2=CX^3(CF_2)_qX^4$, more preferably $CF_2=CFOR^1$ or $CH_2=CX^3(CF_2)_qX^4$.

$CF_2=CFOR^1$ may, for example, be $CF_2=CFOCF_2CF_3$, $CF_2=CFOCF_2CF_2CF_3$, $CF_2=CFOCF_2CF_2CF_2CF_3$ or $CF_2=CFO(CF_2)_8F$. It is preferably $CF_2=CFOCF_2CF_2CF_3$.

$CH_2=CX^3(CF_2)_qX^4$ may, for example, be $CH_2=CH(CF_2)_2F$, $CH_2=CH(CF_2)_3F$, $CH_2=CH(CF_2)_4F$, $CH_2=CF(CF_2)_3H$ or $CH_2=CF(CF_2)_4H$. It is preferably $CH_2=CH(CF_2)_4F$ or $CH_2=CH(CF_2)_2F$.

The monomer (hereinafter referred to also as the AM monomer) having an acid anhydride residue and a polymerizable unsaturated bond in the present invention, may, for example, be itaconic anhydride (hereinafter referred to as IAH), citraconic anhydride (hereinafter referred to as CAH), 5-norbornene-2,3-dicarboxylic anhydride (hereinafter referred to as NAH) or maleic anhydride. It is preferably at least one member selected from the group consisting of IAH, CAH and NAH, more preferably IAH or CAH.

It is more preferred to employ at least one member selected from the group consisting of IAH, CAH and NAH, whereby a fluorocopolymer having an acid anhydride residue can easily be produced without using a special polymerization method required when maleic anhydride is employed (JP-A-11-193312).

In the fluorocopolymer in the present invention, units (a) are from 50 to 99.89 mol %, units (b) are from 0.1 to 49.99 mol %, and units (c) are from 0.01 to 5 mol %, based on ((a)+(b)+(c)). Preferably, repeating units (a) are from 50 to 99.4 mol %, repeating units (b) are from 0.5 to 49.9 mol %, and repeating units (c) are from 0.1 to 3 mol % More preferably, repeating units (a) are from 50 to 98.9 mol %, repeating units (b) are from 1 to 49.9 mol %, and repeating units (c) are from 0.1 to 2 mol % When the contents of repeating units (a), (b) and (c) are within such ranges, the electrical insulator layer (A) will be excellent in the heat resistance and chemical resistance. Further, when the content of repeating units (b) is within this range, the fluorocopolymer will be excellent in the moldability and excellent in mechanical properties such as stress cracking resistance. When the content of repeating units (c) is within this range, the electrical insulator layer (A) will be excellent in adhesion with the electrical conductor layer (B).

Further, the fluorocopolymer in the present invention may contain repeating units based on a dicarboxylic acid such as itaconic acid, citraconic acid, 5-norbornene-2,3-dicarboxylic acid or maleic acid, obtainable by hydrolysis of the AM monomer. In a case where repeating units based on such a dicarboxylic acid are contained, the content of the above repeating units (c) represents the total amount of repeating units based on the AM monomer and the repeating units based on the dicarboxylic acid.

In the fluorocopolymer of the present invention, ((a)+(b)+(c)) based on the entire repeating units, is preferably at least 60 mol %, more preferably at least 65 mol %, most preferably at least 68 mol %.

The fluorocopolymer in the present invention preferably contains, in addition to repeating units (a), (b) and (c), repeating units (d) based on a non-fluorinated monomer excluding the AM monomer.

The non-fluorinated monomer may, for example, be an olefin having at most 3 carbon atoms, such as ethylene (hereinafter referred to as E) or propylene (hereinafter referred to as P), a vinylester such as vinyl acetate (hereinafter referred to as VOA), or a vinylether such as ethyl vinyl ether or cyclohexyl vinyl ether. It is preferably E, P or VOA, more preferably E.

In a case where repeating units (d) are contained, their content is such that the molar ratio of ((a)+(b)+(c))/(d) is preferably from 100/5 to 100/90, more preferably from 100/5 to 100/80, most preferably from 100/10 to 100/66.

Preferred specific examples of the fluorocopolymer in the present invention include a $TFE/CF_2=CFOCF_2CF_2CF_3/$IAH copolymer, a $TFE/CF_2=CFOCF_2CF_2CF_3/CAH$ copolymer, a TFE/HFP/IAH copolymer, a TFE/HFP/CAH copolymer, a TFE/VdF/IAH copolymer, a TFE/VdF/CAH copolymer, a $TFE/CH_2=CH(CF_2)_4F/IAH/E$ copolymer, a $TFE/CH_2=CH(CF_2)_4F/CAH/ethylene$ copolymer, a $TFE/CH_2=CH(CF_2)_2F/IAH/E$ copolymer, a $TFE/CH_2=CH(CF_2)_2F/CAH/E$ copolymer, a $CTFE/CH_2=CH(CF_2)_4F/IAH/E$ copolymer, a $CTFE/CH_2=CH(CF_2)_4F/CAH/E$ copolymer, a $CTFE/CH_2=CH(CF_2)_2F/IAH/E$ copolymer and a $CTFE/CH_2=CH(CF_2)_2F/CAH/E$ copolymer.

It is also preferred that the fluorocopolymer in the present invention has functional groups such as ester groups, carbonate groups, hydroxyl groups, carboxyl groups, carbonyl fluoride groups or acid anhydride groups, as polymer terminal groups, whereby adhesion between the electrical insulator layer (A) and the electrical conductor layer (B) will be improved. Such polymer terminal groups are preferably introduced by suitably selecting a radical polymerization initiator, a chain transfer agent, etc. to be used for the production of the fluorocopolymer.

The volume flow rate (hereinafter referred to as value Q) of the fluorocopolymer in the present invention is preferably from 0.1 to 1,000 mm³/sec. The value Q is an index showing the melt flowability of the fluorocopolymer and will be an index for the molecular weight. The larger the value Q, the smaller the molecular weight, and the smaller the value Q, the higher the molecular weight. The value Q in the present invention is the extrusion rate of the fluorocopolymer when it is extruded into an orifice with a diameter of 2.1 mm and a length of 8 mm under a load of 7 kg at a temperature higher by 50° C. than the melting point of the resin by means of a flow tester manufactured by Shimadzu Corporation. If the value Q is too small, the forming property by extrusion will be poor, and if it is too large, the mechanical strength of the fluorocopolymer will be low. The value Q of the fluorocopolymer is more preferably from 5 to 500 mm$^3$/sec, most preferably from 10 to 200 mm$^3$/sec.

The production method for the fluorocopolymer of the present invention is not particularly limited, and a polymerization method employing a radical polymerization initiator is used. The polymerization method may be bulk polymerization, solution polymerization using an organic solvent such as a fluorinated hydrocarbon, a chlorinated hydrocarbon, a fluorochlorinated hydrocarbon, an alcohol or a hydrocarbon, suspension polymerization using an aqueous medium, and if necessary, a suitable organic solvent, or emulsion polymerization using an aqueous medium and an emulsifier, and particularly preferred is solution polymerization.

The radical polymerization initiator may, for example, be a radical polymerization initiator having a temperature for a half life of 10 hours being preferably from 0° C. to 100° C., more preferably from 20 to 90° C. Specific examples include an azo dye such as azo bisisobutyronitrile; a non-fluorinated diacyl peroxide such as isobutyryl peroxide, octanoyl peroxide, benzoyl peroxide or lauroyl peroxide; a peroxy dicarbonate such as diisopropyl peroxycarbonate; a peroxy ester such as tert-butyl peroxypivalate, tert-butyl peroxyisobutyrate or tert-butyl peroxyacetate; a fluorinated diacyl peroxide such as a compound represented by $(Z(CF_2)_rCOO)_2$ (wherein Z is a hydrogen atom, a fluorine atom, or a chlorine atom, and r is an integer of from 1 to 10); and an inorganic peroxide such as potassium persulfate, sodium persulfate, or a ammonium persulfate.

In the present invention, it is preferred to use a chain transfer agent in order to control the value Q of the fluorocopolymer. Such a chain transfer agent may, for example, be an alcohol such as methanol or ethanol, a chlorofluorohydrocarbon such as 1,3-dichloro-1,1,2,2,3-pentafluoropropane or 1,1-dichloro-1-fluoroethane, or a hydrocarbon such as pentane, hexane or cyclohexane. Further, it is preferred to employ a chain transfer agent having a functional group such as an ester group, a carbonate group, a hydroxyl group, a carboxyl group or a carbonyl fluoride group, whereby adhesive polymer terminal groups will be introduced to the fluorocopolymer. Such a chain transfer agent may, for example, be acetic acid, acetic anhydride, methyl acetate, ethylene glycol or propylene glycol.

The polymerization conditions are not particularly limited, and the polymerization temperature is preferably from 0 to 100° C., more preferably from 20 to 90° C. The polymerization pressure is preferably from 0.1 to 10 MPa, more preferably from 0.5 to 3 MPa. The polymerization time is preferably from 1 to 30 hours.

The concentration of the AM monomer in the polymer is preferably from 0.01 to 5%, more preferably from 0.1 to 3%, most preferably from 0.1 to 1%, based on all monomers. If the concentration of the AM monomer is too high, the polymerization rate tends to be low. When it is within the above range, the polymerization rate during the production is proper, and the adhesion of the fluorocopolymer will be good. During the polymerization, as the AM monomer is consumed by polymerization, it is preferred to continuously or intermittently supply the consumed amount into the polymerization tank to maintain the AM monomer concentration to be within this range.

The thickness of the electrical insulator layer (A) is preferably from 10 to 500 µm, more preferably from 20 to 300 µm. If the thickness is thinner than the above range, the printed wiring board tends to be deformed or bent, and the circuit wiring tends to be broken. On the other hand, if it is thicker than the above range, the thickness will increase when laminated, whereby it tends to be difficult to meet with the requirements for small sizing or weight reduction. When the thickness is within this range, the laminated film tends to be scarcely deformed or bent and excellent in flexibility, and the printed wiring board can meet with the requirements for small sizing and weight reduction.

It is also preferred that the fluorocopolymer in the electrical insulator layer (A) contains an inorganic filler with low dielectric constant and dielectric loss tangent. Such an inorganic filler may, for example, be silica, clay, talc, calcium carbonate, mica, diatomaceous earth, alumina, zinc oxide, titanium oxide, calcium oxide, magnesium oxide, iron oxide, tin oxide, antimony oxide, calcium hydroxide, magnesium hydroxide, aluminum hydroxide, basic magnesium carbonate, magnesium carbonate, zinc carbonate, barium carbonate, dawsonite, hydrotalcite, calcium sulfate, barium sulfate, calcium silicate, montmorillonite, bentonite, activated earth, sepiolite, imogolite, selicite, glass fiber, glass beads, silica balloons, carbon black, carbon nanotube, carbon nanohorn, graphite, carbon fiber, glass balloons, carbon balloons, wood powder or zinc borate. Such inorganic fillers may be used alone or in combination as a mixture of two or more of them.

The content of the inorganic filler is preferably from 0.1 to 100 mass %, more preferably from 0.1 to 60 mass %, based on the fluorocopolymer. Further, such an inorganic filler is preferably porous, whereby the dielectric constant and dielectric loss tangent of the electrical insulator layer (A) can further be made low.

Further, the inorganic filler is preferably subjected to surface treatment with a surface treating agent such as a silane coupling agent or a titanate coupling agent in order to improve the dispersibility in the fluorocopolymer.

The electrical conductor layer (B) in the present invention is preferably made of an electrically low resistive and electrically conductive metal foil, more preferably made of a metal foil of copper, silver, gold or aluminum Such metals may be used alone or in combination of two or more of them. As a method of using two or more metals in combination, it is preferred to apply metal plating to a metal foil. Particularly preferred is a copper foil having gold plating applied thereon.

The electrical conductor layer (B) in the present invention is preferably made of a metal foil of copper, silver, gold or aluminum, or a copper foil having gold plating applied thereon. The thickness of the electrical conductor layer (B) is preferably from 0.1 to 100 µm, more preferably from 1 to 50 µm, most preferably from 1 to 30 µm.

The electrical conductor layer (B) has a surface roughness (hereinafter referred to also as Rz) of at most 10 µm on the side being in contact with the electrical insulator layer (A). Hereinafter, the side of the surface having irregularities will be referred to as a roughened surface. In order to reduce the skin effect during the use in a high frequency region, Rz of the roughened surface of the electrical conductive layer (B) is preferably from 0.1 to 5 µm, more preferably from 0.1 to 3 µm, most preferably from 0.1 to 2 µm. It is also preferred that the electrical conductor layer (B) has an oxide coating film of e.g. a chromate having an anti-corrosive property on the surface on the side opposite to the roughened surface.

The laminate for a printed wiring board of the present invention has a laminate structure wherein the electrical insulator layer (A) and the electrical conductor layer (B) are directly bonded to each other. FIG. 1 shows a cross-sectional view of one embodiment of the laminate for a printed wiring board of the present invention. Such a laminate comprises an electrical insulator layer (A)1 and an electrical conductor layer (B)2. The double layer laminate comprising the electrical insulator layer (A)1 and the electrical conductor layer (B)2 can be used as a single-sided printed wiring board.

Further, the laminate for a printed wiring board of the present invention may, for example, be a laminate for a double-side printed wiring board composed of three layers of electrical conductor layer (B)/electrical insulator layer (A)/ electrical conductor layer (B), obtained by laminating an electrical conductor layer (B) further on another surface of the above-mentioned laminate for a single-sided printed wiring board, or a laminate for a multilayer printed wiring board obtained by laminating electrical insulator layer (A)/electrical conductor layer (B) in multiple layers. Such a laminate is useful by itself as a printed wiring board.

Further, using the above double layer laminate or the like as a buildup layer, it is possible to produce a multilayer circuit board (a buildup board) formed by laminating a single buildup layer or plural buildup layers on the surface of a base plate. As the base plate to be used for the buildup board, an electrical insulator containing a resin other than the fluorocopolymer may be employed. Specific examples of such an electrical insulator include a woven fabric of an inorganic fiber such as glass fiber, a woven fabric or non-woven fabric of an organic fiber such as a polyester, a polyamide, an aramide resin, a fluororesin or cotton, and an electrical insulator having plural sheets of paper or the like combined with the fluorocopolymer by a method such as lamination. Among them, it is preferred to use, as the base plate, an electrical insulator having a fluororesin such as PTFE combined with a woven fabric of glass fiber, silica fiber or the like.

As the method for producing the laminate for a printed wiring board of the present invention, various compression molding methods, extrusion methods, laminating methods or coating methods may be mentioned. A method may, for example, be mentioned wherein the fluorocopolymer is formed into a film by a method such as an extrusion method or a press forming method, and then, the obtained fluorocopolymer film is laminated on an electrically conductive metal foil forming the electrical conductor layer (B), or a film of the fluorocopolymer is extrusion-laminated on an electrically conductive metal foil. Particularly preferred is the extrusion laminating method, since it is excellent in productivity, and the laminate can be produced at a low cost.

In a case where the electrical insulator layer (A) and the electrical conductor layer (B) are to be bonded by press forming at the time of producing the laminate for a printed wiring board of the present invention, the temperature as a pressing condition is preferably from 200 to 380° C., more preferably from 220 to 350° C. The pressure is preferably from 0.3 to 30 MPa, more preferably from 0.5 to 20 MPa, most preferably from 1 to 10 MPa. The time is preferably from 3 to 240 minutes, more preferably from 5 to 120 minutes, most preferably from 10 to 80 minutes. As the pressing plate to be used for the press forming, a stainless steel plate is preferred.

The method for producing a printed wiring board by forming a wiring circuit on the surface of the laminate of the present invention, may, for example, be a method of etching the electrical conductor layer (B) on the surface of the laminate, or a method of treating the surface with plating.

EXAMPLES

Now, the present invention will be described in detail with reference to Examples, but it should be understood that the present invention is by no means restricted thereto. Examples 1 to 4 are Working Examples of the present invention, and Example 5 is a Comparative Example. Here, the dielectric constant and dielectric loss tangent, and the adhesion were measured by the following methods.

Content of Repeating Units Based on IAH or CAH

A fluorocopolymer was press-formed to obtain a film of 200 μm. In the infrared absorption spectrum, the absorption peak of the stretching vibration of C=O in the repeating units based on IAH or CAH in the fluorocopolymer appears at 1,870 cm$^{-1}$ in each case. The absorbance at the absorption peak is measured, and the content M (mol %) of the repeating units based on IAH or CAH was determined by means of the relational expression of M=aL, where L is the absorbance at 1,870 cm$^{-1}$, and a is a coefficient. As a, a=0.87 was employed, which was determined by using IAH as the model compound.

Measurements of Dielectric Constant and Dielectric Loss Tangent

A film of a fluorocopolymer having a thickness of 3 mm was cut into a size of 200 mm×120 mm to obtain a test film. A conductive paste was applied on each side of the test film to form wiring, whereupon the dielectric constant and dielectric loss tangent at 1 MHz were measured.

Adhesion

The adhesion was measured in accordance with IPC TM-650 2.4.8. A laminated film was cut to obtain a test film having a length of 150 mm and width of 10 mm. From an end in the longitudinal direction of the test film to a position at 50 mm from the end, the electrical insulator layer (A) and the electrical conductor layer (B) were peeled. Then, with that position at the center, they were peeled by means of a tensile tester at a peeling angle of 180° and a tensile speed of 50 mm/min, whereby the maximum load was taken as the peel strength (N/10 mm) The larger the peel strength, the better the adhesion.

Example 1

A polymerization tank having an internal capacity of 94 L and equipped with a stirrer, was deaerated, and 71.3 kg of 1-hydrotridecafluorohexane (hereinafter referred to as HTH), 20.4 kg of 1,3-dichloro-1,1,2,2,3-pentafluoropropane (AK225cb manufactured by Asahi Glass Company, Limited, hereinafter referred to as AK225cb), 562 g of $CH_2$=CH $(CF_2)_2$ F and 4.45 g of IAH were charged. The interior of the polymerization tank was heated to 66° C., and an initial monomer mixed gas of TFE/E in a molar ratio of 89/11 was introduced to raise the pressure to 1.5 MPa/G. As a polymerization initiator, 1 L of a 0.7% HTH solution of tert-butyl peroxypivalate was charged to initiate the polymerization. In order to maintain the pressure to be constant during the polymerization, the monomer mixed gas of TFE/E in a molar ratio of 59.5/40.5 was continuously charged. Further, $CH_2$=CH $(CF_2)_2$F in an amount corresponding to 3.3 mol % and IAH in an amount corresponding to 0.8 mol %, based on the total molar amount of TFE and E charged during the polymerization, were continuously charged. After 9.9 hours from the initiation of the polymerization and when 7.28 kg of the monomer mixture gas was charged, the internal temperature of the polymerization tank was lowered to room temperature, and the gas was purged to normal pressure.

The obtained fluorocopolymer 1 in a slurry form was put into a granulation tank of 200 L charged with 77 kg of water, and then heated to 105° C. with stirring and granulated while the solvent was distilled off. The obtained granulated product was dried at 150° C. for 15 hours to obtain 6.9 kg of a granulated product 1 of the fluorocopolymer 1.

From the results of the NMR analysis of melt, the fluorine content analysis and the infrared absorption spectrum analysis, the copolymer composition of the fluorocopolymer 1 was found to be such that the molar ratio of repeating units based on TFE/repeating units based on $CH_2=CH(CF_2)_2F$/repeating units based on IAH/repeating units based on E was 93.5/5.7/0.8/62.9. The melting point was 230° C., and the value Q was 48 mm$^3$/sec.

The fluorocopolymer 1 was formed by extrusion to obtain a film 1 having a thickness of 50 μm. The dielectric constant of the fluorocopolymer 1 was 2.7, and the dielectric loss tangent was 0.005.

The film 1 and an electrolytic copper foil CF-T9FZ-HTE-18 (manufactured by FUKUDA METAL FOIL POWDER Co., Ltd.) having a thickness of 18 μm, a width of 380 mm and RZ of 7.0 μm as the electrical conductor layer (B) were subjected to vacuum pressing at a temperature of 280° C. under a pressure of 3.7 MPa for 5 minutes to obtain a double layer laminated film composed of layer of fluorocopolymer 1/layer of electrolytic copper foil and having a thickness of 68 μm. In such a laminated film, the peel strength between the layer of the fluorocopolymer 1 and the layer of the electrolytic copper foil was 31 N/10 mm, thus showing an adequate adhesion force.

Example 2

The polymerization tank used in Example 1 was deaerated, and 902 kg of AK225cb, 0.216 kg of methanol, 31.6 kg of $CF_2=CFOCF_2CF_2CF_3$ and 0.43 kg of IAH were charged. The interior of the polymerization tank was raised to 50° C., and TFE was charged until the pressure became 0.38 MPa. As a polymerization initiator solution, 50 mL of 0.25% AK225cb solution of di(perfluorobutyryl) peroxide was charged to initiate the polymerization. In order to maintain the pressure to be constant during the polymerization, TFE was continuously charged. The above polymerization initiator solution was additionally added as the case requires, and the charging rate of TFE was maintained to be substantially constant. The polymerization initiator solution was charged in a total amount of 120 mL. Further, IAH in an amount corresponding to 1 mol % of TFE continuously charged, was charged. After 6 hours from the initiation of the polymerization and when 7.0 kg of TFE was charged, the interior of the polymerization tank was cooled to room temperature, and unreacted TFE was purged.

The obtained fluorocopolymer 2 in a slurry form was put into a granulation tank of 200 L charged with 75 kg of water, then heated to 105° C. with stirring and granulated while the solvent was distilled off. The obtained granulated product was dried at 150° C. for 5 hours to obtain 7.5 kg of a granulated product 2 of the fluorocopolymer 2.

From the results of the NMR analysis of melt, the fluorine content analysis and the infrared absorption spectrum analysis, the copolymer composition of the fluorocopolymer 2 was such that repeating units based on TFE/repeating units based on $CF_2=CFOCF_2CF_2CF_3$/repeating units based on IAH=97.7/2.0/0.3. The melting point was 292° C., and the value Q was 15 mm$^3$/sec.

The granulated product 2 of the fluorocopolymer 2 was formed by extrusion to obtain a film 2 having a thickness of 50 μm. The dielectric constant of the fluorocopolymer 2 was 2.7, and the dielectric loss tangent was 0.005.

The film 2 and an electrolytic copper foil CF-T9FZ-HTE -18 were subjected to vacuum pressing under the same conditions as in Example 1 to obtain a double layer laminated film composed of layer of the fluorocopolymer 2/layer of electrolytic copper foil and having a thickness of 68 μm. In such a laminated film, the peel strength between the layer of the fluorocopolymer 2 and the layer of the electrolytic copper foil was 20 N/10 mm in width, thus showing an adequate adhesive force.

Example 3

In the same manner as in Example 1 except that a rolled copper foil RCF-T4A-18 (manufactured by FUKUDA METAL FOIL POWDER Co., Ltd.) having a thickness of 18 μm, a width of 380 nm and Rz of 0.8 μm was used as the electrical conductor layer (B) in Example 1, a double layer laminated film composed of layer of rolled copper foil/layer of fluorocopolymer 1 and having a thickness of 68 μm, was obtained. In such a laminated film, the peel strength between the layer of the fluorocopolymer 1 and the layer of the rolled copper foil was 20 N/10 mm in width, thus showing an adequate adhesive force.

Example 4

Using a rolled copper foil RCF-T4A-18 as the electrical conductor layer (B) in Example 2, bonding was carried out under the same conditions as in Example 2 to obtain a double layer laminated film composed of layer of fluorocopolymer 2/layer of rolled copper foil and having a thickness of 68 μm. In such a laminated film, the peel strength between the layer of the fluorocopolymer 2 and the layer of the rolled copper foil was 15 N/10 mm in width, thus showing an adequate adhesive force.

Example 5 (Comparative Example)

As the fluorocopolymer, an ethylene/tetrafluoroethylene copolymer i.e. Fluon ETFEC-88AXP (manufactured by Asahi Glass Company, Limited, hereinafter referred to as ETFE) having no repeating units based on the AM monomer was formed by extrusion to obtain an ETFE film having a thickness of 50 μm. Using such ETFE film, a double layer laminated film composed of layer of ETFE film/layer of electrolytic copper foil and having a thickness of 68 μm, was prepared in the same manner as in Example 1. In such a laminated film, the peel strength between the layer of the ETFE film and the layer of electrolytic copper foil was 0.03 N/10 mm in width, and the layers were easily manually peeled, and the adhesion was inadequate.

INDUSTRIAL APPLICABILITY

A printed wiring board obtained from the laminate for a printed wiring board of the present invention is useful for a radar requiring high frequency characteristics, a router for network, a backplane or a wireless infrastructure. Further, it is useful for various censors for automobiles, which require chemical resistance and heat resistance, and as base plates for engine management censors. Further, it may be used as a buildup printed wiring board or a flexible printed wiring board. Further, it may be used as a base material for ID tag.

The entire disclosure of Japanese Patent Application No. 2004-356277 filed on Dec. 9, 2004 including specification, claims, drawings and summary is incorporated herein by reference in its entirety.

What is claimed is:

1. A laminate for a printed wiring board having a laminate structure comprising an electrical insulator layer (A) and an electrical conductor layer (B) bonded directly to each other, wherein the electrical insulator layer (A) is formed of a fluorocopolymer comprising repeating units (a) based on tetrafluoroethylene and/or chlorotrifluoroethylene, repeating units (b) based on a fluoromonomer excluding tetrafluoroethylene and chlorotrifluoroethylene, and repeating units (c) based on a monomer having an acid anhydride residue and a polymerizable unsaturated bond in amounts of (a) being from 50 to 99.89 mol %, (b) being from 0.1 to 49.99 mol % and (c) being from 0.01 to 5 mol %, based on ((a)+(b)+(c)), and the electrical conductor layer (B) has a surface roughness of at most 10 μm on the side being in contact with the electrical insulator layer (A).

2. The laminate for a printed wiring board according to claim 1, wherein the fluorocopolymer further contains repeating units (d) based on a non-fluorinated monomer excluding the monomer having an acid anhydride residue and a polymerizable unsaturated bond, and the molar ratio of ((a)+(b)+(c))/(d) is from 100/5 to 100/90.

3. The laminate for a printed wiring board according to claim 1, wherein the monomer having an acid anhydride residue and a polymerizable unsaturated bond, is at least one member selected from the group consisting of itaconic anhydride, citraconic anhydride and 5-norbornene-2,3-dicarboxylic anhydride.

4. The laminate for a printed wiring board according to claim 1, wherein the electrical conductor layer (B) is made of a metal foil of copper, silver, gold or aluminum, or a copper foil having gold plating applied thereon.

5. The laminate for a printed wiring board according to claim 1, wherein the electrical conductor layer (B) has a thickness of at most 20 μm.

6. The laminate for a printed wiring board according to claim 1, wherein the electrical conductor layer (B) is made of a copper foil.

7. The laminate for a printed wiring board according to claim 1, wherein said surface roughness is from 0.1 to 5 μm.

8. The laminate for a printed wiring board according to claim 1, wherein the electrical insulator layer (A) is formed of a fluorocopolymer comprising repeating units based on tetrafluoroethylene and chlorotrifluoroethylene.

9. The laminate for a printed wiring board according to claim 1, wherein the electrical insulator layer (A) is formed from a fluorocopolymer comprising repeating units of itaconic anhydride, $CH_2=CH(CF_2)_2F$, tetrafluoroethylene, and ethylene.

10. The laminate for a printed wiring board according to claim 1, wherein the electrical insulator layer (A) is formed of a fluorocopolymer comprising repeating units based on tetrafluoroethylene, $CF_2=CFOCF_2CF_2CF_3$ and itaconic anhydride.

11. The laminate for a printed wiring board according to claim 1, wherein the peel strength of the insulator layer (A) and the electrical conductor layer (B) has a peel strength according to IPCTM-6502.4.8 of from 15N/10 mm to 31N/10 mm.

12. The laminate for a printed wiring board according to claim 1, wherein the electrical insulator layer (A) is formed of at least one fluorocopolymer selected from the group consisting of a $CF_2=CF_2/CF_2=CFOCF_2CF_2CF_3$/(itaconic anhydride) copolymer, a $CF_2=CF_2/CF_2=CFOCF_2CF_2CF_3$/(citraconic anhydride)copolymer, a $CF_2=CF_2$/hexafluoropropylene/(itaconic anhydride)copolymer, a $CF_2=CF_2$/hexafluoropropylene/(citraconic anhydride) copolymer, a $CF_2=CF_2$/(vinylidene fluoride)/(itaconic anhydride)copolymer, a $CF_2=CF_2$/(vinylidene fluoride)/(citraconic anhydride) copolymer, a $CF_2=CF_2/CH_2=CH(CF_2)_4F$/(itaconic anhydride)/ethylene copolymer, a $CF_2=CF_2/CH_2=CH(CF_2)_4F$/(citraconic anhydride)/ethylene copolymer, a $CF_2=CF_2/CH_2=CH(CF_2)_2F$/(itaconic anhydride)/ethylene copolymer, a $CF_2=CF_2/CH_2=CH(CF_2)_2F$/(citraconic anhydride)/ethylene copolymer, a $CClF=CF_2/CH_2=CH(CF_2)_4F$/(itaconic anhydride)/ethylene copolymer, a $CClF=CF_2/CH_2=CH(CF_2)_4F$/(citraconic anhydride)/ethylene copolymer, a $CClF=CF_2/CH_2=CH(CF_2)_2F$/(itaconic anhydride)/ethylene copolymer and a $CClF=CF_2/CH_2=CH(CF_2)_2F$/(citraconic anhydride)/ethylene copolymer.

13. The laminate for a printed wiring board according to claim 1, wherein the fluorocopolymer of the electrical insulator layer (A) further comprises an inorganic filler.

14. The laminate for a printed wiring board according to claim 1, wherein the electrical conductor layer (B) has a chromate film coating on the side opposite to the roughened surface.

15. The laminate for a printed wiring circuit board according to claim 1, wherein the electrical insulated layer (A) is formed of a fluorocopolymer film covering a woven fibrous film.

16. The laminate for a printed wiring board according to claim 1, wherein the electrical insulator layer (A) and the electrical conductor layer (B) are in direct and continuous contact.

17. The laminate for a printed wiring board according to claim 1, wherein the electrical conductor layer (B) is a copper foil having gold plating.

18. A single-sided printed wiring board, comprising:
the laminate for a printed wiring board of claim 1.

19. A double-sided printed wiring board, comprising:
the laminate for a printed wiring board of claim 1, and
an electrical conductor layer (B) laminated to the surface of the insulator layer (A).

20. A multilayer circuit board, comprising:
a base plate layer, and
the laminate for a printed wiring board of claim 1.

21. The multilayer circuit board of claim 20, wherein the base plate is at least one electrical insulator layer selected from the group consisting of a woven inorganic fiber, a woven organic fiber, and an electrical insulator having a plurality of sheets of paper.

* * * * *